(12) United States Patent
Yasutake et al.

(10) Patent No.: US 8,111,079 B2
(45) Date of Patent: Feb. 7, 2012

(54) CONDUCTIVITY MEASURING APPARATUS AND CONDUCTIVITY MEASURING METHOD

(75) Inventors: Masatoshi Yasutake, Chiba (JP); Takakazu Fukuchi, Chiba (JP)

(73) Assignee: SII NanoTechnology Inc. (JP)

( * ) Notice: Subject to any disclaimer, the term of this patent is extended or adjusted under 35 U.S.C. 154(b) by 369 days.

(21) Appl. No.: 12/378,181

(22) Filed: Feb. 11, 2009

(65) Prior Publication Data

US 2009/0206855 A1   Aug. 20, 2009

(30) Foreign Application Priority Data

Feb. 14, 2008   (JP) ................................. 2008-033291

(51) Int. Cl.
*G01R 27/08*   (2006.01)
(52) U.S. Cl. ............ 324/715; 324/722; 324/724; 73/105
(58) Field of Classification Search .......... 324/658–716, 324/722, 724; 73/105; 850/40, 52, 56, 57, 850/62, 63
See application file for complete search history.

(56) References Cited

U.S. PATENT DOCUMENTS

2006/0243034 A1* 11/2006 Chand et al. .................... 73/104
2008/0314131 A1* 12/2008 Yasutake et al. ................ 73/105
* cited by examiner

*Primary Examiner* — Huy Q Phan
*Assistant Examiner* — Son Le
(74) *Attorney, Agent, or Firm* — Adams & Wilks

(57) ABSTRACT

A conductivity measuring apparatus includes a probe base having a pair of electrodes disposed on respective opposite surfaces of a portion of the probe base. Observing and grasping probes are supported by the probe base in a cantilever state and are arranged adjacent to and spaced apart from one another by a predetermined distance. The grasping probe has a pair of electrodes disposed on respective opposite surfaces of a portion of the grasping probe confronting the portion of the probe base. A voltage apparatus applies a voltage between the pairs of electrodes on the probe base and the grasping probe to adjust the predetermined distance between the grasping and observing probes. A movement mechanism moves a sample base and the observing and grasping probes relative to each other to bring conductive tips of the observing and grasping probes into contact with respective contact points on a sample supported on the sample base. A measurement apparatus measures a conductivity between the contact points on the sample on the basis of a current flow generated between the conductive tips of the observing and grasping probes.

13 Claims, 12 Drawing Sheets

CONDUCTIVITY MEASURING APPARATUS AND CONDUCTIVITY MEASURING METHOD

BACKGROUND OF THE INVENTION

1. Field of the Invention

The present invention relates to a conductivity measuring apparatus and a conductivity measuring method of measuring a conductivity of a sample of a board or the like, or a conductivity of a small sample.

2. Description of the Related Art

In order to measure an electric property of an extremely small region at a surface of a semiconductor or the like, as shown by, for example, Patent References 1, 2, there is used a conductivity measuring apparatus of a scanning tunnel microscope or the like having a measuring probe arranged with four styluses on straight lines at equal intervals. According to a conductivity measuring method by the measuring probe, a voltage is applied in a state of bringing two pieces of styluses arranged on an outer side (outer side probe) into contact with or proximate to a sample, a voltage drop generated by an electric resistance of the sample is measured by remaining two pieces of styluses arranged on an inner side (observing probe and grabbing probe), thereby, a surface property including section information at the position is measured.

According to the measuring probe, when the voltage is applied between the two outer side pieces of styluses, the more separated the interval between the two outer side pieces of styluses, up to the deeper position of the sample, the section information can be measured by the two inner side pieces of styluses.

Patent Reference 1: JP-A-2004-93352
Patent Reference 2: JP-A-2002-31655

However, according to the conductivity measuring apparatus of the background art, the following problem is posed.

First, two pieces of styluses arranged on the inner side are driven by drive sources separate from each other, and therefore, a separating distance of the two probes arranged on the inner side cannot accurately and continuously be adjusted.

Second, in relation to the first problem, the separating distance of two pieces of the styluses arranged on the inner side cannot accurately be adjusted, and therefore, there poses a problem that a conductivity of extremely proximate portions cannot accurately be measured.

Third, a force of pressing the measuring probe to the sample cannot be adjusted, and therefore, a reproducibility of the pressing force is poor.

Fourth, two pieces of the styluses arranged on the inner side are driven by the drive sources separate from each other, and therefore, the electric property cannot be measured by accurately picking up a small sample.

Fifth, a conductivity of a predetermined portion cannot be measured by selecting and grasping the predetermined portion by observing a shape of the sample and by being isolated from the other portion.

SUMMARY OF THE INVENTION

The invention has been carried out in view of the foregoing problem and provides a conductivity measuring apparatus and a conductivity measuring method capable of resolving the foregoing problem.

In order to resolve the foregoing problem, the invention proposes the following means.

A conductivity measuring apparatus of the invention comprises a sample base fixed with a sample on a sample support face, a two terminals tweezers having an observing probe and a grasping probe arranged above the sample and arranged contiguously to each other in a state of being spaced apart from each other by a predetermined separating distance along a face in parallel with the sample support face, moving means for moving the sample base and the two terminals tweezers relative to each other in a direction in parallel with the sample support face and a direction orthogonal to the sample support face, oscillating means for vibrating the observing probe, displacement measuring means for measuring a displacement of the observing probe, probe driving means for moving the grasping probe in a direction of being proximate to or remote from the observing probe and adjusting a distance between the two probes, and first measuring means for bringing the two terminals tweezers respectively into contact with the sample, making a current flow between the two terminals tweezers under the state, and measuring a conductivity between two points on the sample from an electric property between the two terminals tweezers at that occasion.

Further, a conductivity measuring method of the invention is a conductivity measuring method using the conductivity measuring apparatus described above, the conductivity measuring method comprising a positioning step of positioning the two terminals tweezers at a measured point of the sample by adjusting the separating distance by the probe driving means by observing the sample by AFM observation while allowing the observing probe to scan along the sample by operating the moving means, a probe pressing step of respectively moving the two terminals tweezers to a side of the sample relatively by a predetermined length and pressing front ends of the two terminals tweezers respectively to the sample, and a measuring step of measuring the conductivity between the measured points of the sample by making a current flow between the two terminals tweezers and from the electric property between the two terminals tweezers at that occasion by the first measuring means.

According to the invention, first, the sample is observed while allowing the observing probe to scan along the sample by operating the moving means by AFM observation. Thereby, it can be grasped by what surface shape (height, outer shape or the like) the sample is constituted and the position of the measured point.

Successively, the separating distance is adjusted by the probe driving means, based on acquired position data and shape data, front ends of the two terminals tweezers are relatively moved to be respectively positioned to a measured point.

The observing probe and the grasping probe are arranged along the face in parallel with the sample support face, and relatively moved in the direction in parallel with the sample support face and a direction orthogonal to the sample support face by the moving means. Therefore, the respective front ends of the observing probe and the grasping probe can simultaneously be pressed to the sample.

Further, the position of the measured point can be grasped by AFM observation, and therefore, positioning to a designated position of the measured point can swiftly be carried out.

Successively, the two terminals tweezers is moved relatively to the side of the sample by the predetermined length. The respective probes of the two terminals tweezers are simultaneously be pressed to the sample, and therefore, the respective probes are bent by the predetermined length to the side opposed to the sample. Further, forces of pressing the sample by the respective probes are determined by spring constants and bending amounts to sides of the respective probes of the respective probes opposed to the sample. The bending amounts of the respective probes become constant without depending on the measurement, and therefore, the forces of the respective probes of the two terminals tweezers of pressing the measured point of the sample are respectively made to be constant and a reproducibility of the pressing forces can be promoted.

Finally, the current is made to flow between the two terminals tweezers by the first measuring means and the conductivity between the measured points of the sample is measured from the electric property between the two terminals tweezers at that occasion.

In this way, the separating distance between the two terminals tweezers is adjusted by the single probe driving means, and therefore, the separating distance can accurately and continuously be adjusted. Further, the separating distance can accurately be adjusted, and therefore, the conductivity can accurately be measured by making the separating distance between the two terminals tweezers short up to a predetermined small distance of, for example, 100 nanometers or smaller.

Further, a conductivity measuring apparatus of the invention comprises a sample base fixed with a sample on a sample support face, a four terminals tweezers having an observing probe and a grasping probe arranged above the sample and arranged contiguously to each other in a state of being spaced apart from each other by a predetermined separating distance along a face in parallel with the sample support face, and left and right outer side probes arranged to be remote from the two probes on a linear line connecting the two probes on outer sides of the two probes, moving means for moving the sample base and the four terminals tweezers relative to each other in a direction in parallel with the sample support face and a direction orthogonal to the sample support face, oscillating means for vibrating the observing probe, displacement measuring means for measuring a displacement of the observing probe, probe driving means for adjusting a distance between the two probes by moving the grasping probe in a direction of being proximate to or remote from the observing probe, and second measuring means for bringing the four terminals tweezers respectively into contact with the sample, making a current flow between the left and right outer side probes, and measuring a conductivity between two points on the sample from an electric property between the observing probe and the grasping probe at that occasion.

Further, a conductivity measuring method of the invention is a conductivity measuring method using the conductivity measuring apparatus described above, the conductivity measuring method comprises a positioning step of positioning the observing probe and the grasping probe at a measured point of the sample by adjusting the separating distance by the probe driving means by observing the sample by AFM observation while allowing the observing probe to scan along the sample by operating the moving means, probe pressing means for respectively pressing front ends of the 4 terminals tweezers to the sample by respectively moving the four terminals tweezers to a side of the sample relatively by a predetermined length by operating the moving means, and a measuring step of measuring the conductivity between the measured points of the sample by making a current flow between the left and right outer side probes by the second measuring means and from an electric property between the observing probe and the grasping probe at that occasion.

According to the invention, first, the sample is observed while allowing the observing probe to scan along the sample by operating the moving means by AFM observation. Thereby, it can be grasped by what surface shape (height, outer shape or the like) the sample is constituted and the position of the measured point.

Successively, the separating distance is adjusted by the probe driving means, based on acquired position data and shape data, the front ends of the four terminals tweezers are relatively moved to be respectively positioned to the measured point.

The observing probe and the grasping probe are arranged along the face in parallel with the sample support face, and the left and right side outer side probes are arranged on the linear line connecting the observing probe and the grasping probe. Further, the four terminal tweezers are relatively moved in the direction in parallel with the sample support face and in the direction orthogonal to the sample support face by the moving means. Therefore, the respective front ends of the four terminals tweezers can simultaneously be pressed to the sample.

Further, the position of the measured point can be grasped by AFM observation, and therefore, positioning to the designated position of the measured point can swiftly be carried out.

Successively, the four terminals tweezers is relatively moved to the side of the sample by the predetermined length. The respective probes of the four terminal tweezers are simultaneously pressed to the sample, and therefore, the respective probes are bent by predetermined lengths to the side opposed to the sample. Further, forces of pressing the sample by the respective probes are determined by spring constants and bending amounts to sides of the respective probes opposed to the sample. The bending amounts of the respective probes become constant without depending on measurement, and therefore, the forces of pressing the measured point of the sample by the respective probes of the four terminals tweezers are made to be respectively constant, and the reproducibility of the pressing force can be promoted.

Finally, the current is made to flow between the left and right side outer side probes by the second measuring means, and the conductivity between the measured points of the sample is measured by the electric property between the observing probe and the grasping probe at that occasion.

In this way, the separating distance of the observing probe and the grasping probe is adjusted by the single probe driving means, and therefore, the separating distance can accurately and continuously be adjusted. Further, the separating distance can accurately be adjusted, and therefore, the conductivity can accurately be measured by making the separating distance short up to a predetermined small distance of, for example, 100 nanometers or smaller.

Further, according to the conductivity measuring apparatus of the invention, the probe driving means comprises a pair of combteeth one of which is provided at a probe base of fixing a base end side of the grasping probe and other of which is provided at a middle portion of the grasping probe, respectively to correspond with each other, a pair of electrodes respectively provided at faces of the combteeth opposed to each other, and a voltage apparatus of applying a voltage between the pair of electrodes.

According to the invention, by applying the voltage between the pair of electrodes by the voltage applying means, by an electrostatic force operated between the pair of electrodes, the distance between the pair of combteeth respectively provided at the probe base and the middle portion of the grasping probe in correspondence with each other can be adjusted. Thereby, the separating distance between the observing probe and the grasping probe can accurately and continuously be adjusted.

Further, according to the conductivity measuring method of the invention, in the measuring step, the conductivity between the measured points of the sample is measured while changing the separating distance between the observing probe and the grasping probe by operating the probe driving means.

According to the invention, an influence of the separating distance between the observing probe and the grasping probe effected on the electric property can be measured and the conductivity between the measured points of the sample can further accurately be measured.

Further, a conductivity measuring method of the invention is a conductivity measuring method using the conductivity measuring apparatus described above, the conductivity measuring method comprising a positioning step of observing the sample by AFM observation while allowing the observing probe to scan along the sample by operating the moving means and positioning the observing prove and the grasping probe to a predetermined portion of the sample, a grasping step of grasping the predetermined portion of the sample by the two probes, by making the separating distance between the observing probe and the grasping probe short by operating the probe driving means, and a measuring step of measuring the conductivity between the predetermined portion of the sample by making the current flow between the observing probe and the grasping probe by the first measuring means and from the electric property between the two probes at that occasion after the grasping step.

According to the invention, first, the sample is observed while allowing the observing probe to scan along the sample by operating the moving means by AFM observation. Thereby, it can be grasped by what surface shape (height, outer shape or the like) the sample is constituted and the position and the shape of the predetermined portion.

Successively, the separating distance is adjusted by the probe driving means, based on acquired position data and shape data, positioning is carried out to interpose the predetermined portion of the sample by the two terminals tweezers.

The position and the shape of the predetermined portion can be grasped by AFM observation, and therefore, positioning of the two terminals tweezers to a designated position of the predetermined portion can swiftly be carried out.

Successively, the predetermined portion of the sample is pressed to grasp by the two terminals tweezers by making the separating distance between the two terminals tweezers short by the predetermined distance.

The forces of pressing the predetermined portion by the two terminals tweezers are determined by the spring constants and the bending amounts to the side opposed to the interposed predetermined portion. Bending amounts of the respective probes become constant without depending on the measurement, and therefore, the forces of pressing the predetermined portion by the respective probes of the two terminals tweezers are made to be respectively constant and the reproducibility of the pressing force can be promoted.

Finally, the current is made to flow between the two terminals tweezers by the first measuring means, and the conductivity between the predetermined portions of the sample is measured from the electric property between the two terminals tweezers at that occasion.

In this way, the separating distance between the observing probe and the grasping probe is adjusted by the single probe driving means, and therefore, the conductivity can be measured by accurately and continuously adjusting the separating distance and the accurately picking up the small predetermined portion. Further, the separating distance can accurately be adjusted, and therefore, the predetermined portion is grasped by making the separating distance short up to the predetermined small distance, for example, equal to or smaller than 100 nanometers and the conductivity can accurately be measured.

Further, the conductivity measuring method of the invention comprises a step of cutting to separate a measured portion of selecting a predetermined portion in the sample and cutting to separate the predetermined portion of the sample grasped by the observing probe and the grasping probe from the other portion of the sample after grasping the predetermined portion by operating the moving means between the grasping step and the measuring step not only for a homogeneous and uniform sample but a sample having a nonuniform predetermined portion in the sample.

According to the invention, the conductivity can further accurately be measured by measuring the conductivity between the predetermined portions without being influenced by the sample.

Further, according to the conductivity measuring method of the invention, in the measuring step, the conductivity between the predetermined portions of the sample is measured while changing a grasping force between the predetermined portions of the sample by changing the separating distance between the observing probe and the grasping probe by operating the probe driving means.

According to the invention, an influence of the pressing force between the predetermined portions of the sample effected on the electric property can be measured and the conductivity between the predetermined portions can further accurately be measured.

According to the conductivity measuring apparatus and the conductivity measuring method of the invention, the sample is observed beforehand by the observing probe, and therefore, an accuracy of positioning to the measured sample is excellent, the separating distance between the observing probe and the grasping probe is accurately and continuously adjusted, and the conductivity can accurately be measured by promoting the reproducibility of the forces of pressing the respective probes to the sample. Further, the conductivity of only the predetermined portion can be measured by cutting to separate the portion from the sample face not only for the homogeneous and uniform sample but the sample having a nonuniform predetermined portion of the sample.

DETAILED DESCRIPTION OF THE PREFERRED EMBODIMENTS

First Embodiment

Figure 1:
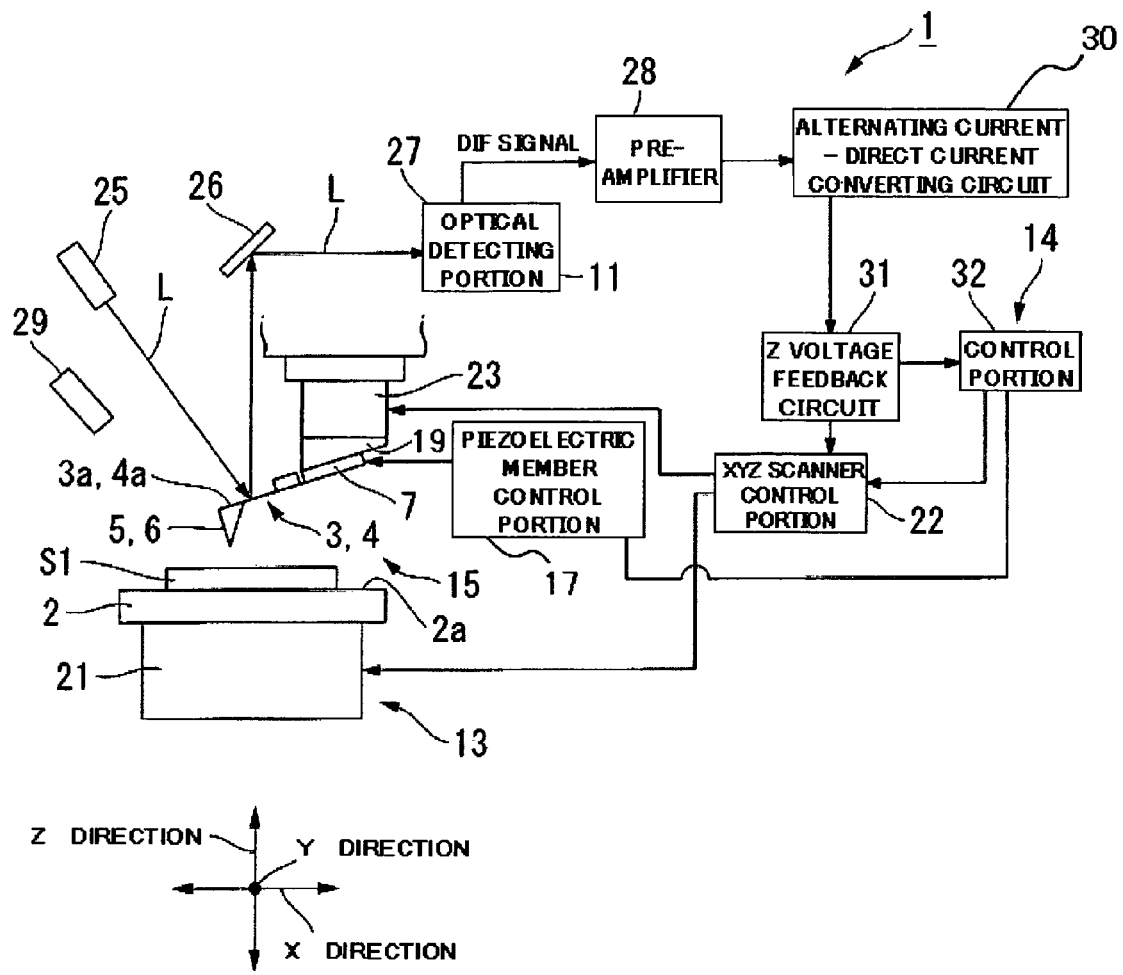
FIG. 1 is a constitution view of a first embodiment of a conductivity measuring apparatus according to the invention.
Figure 2:
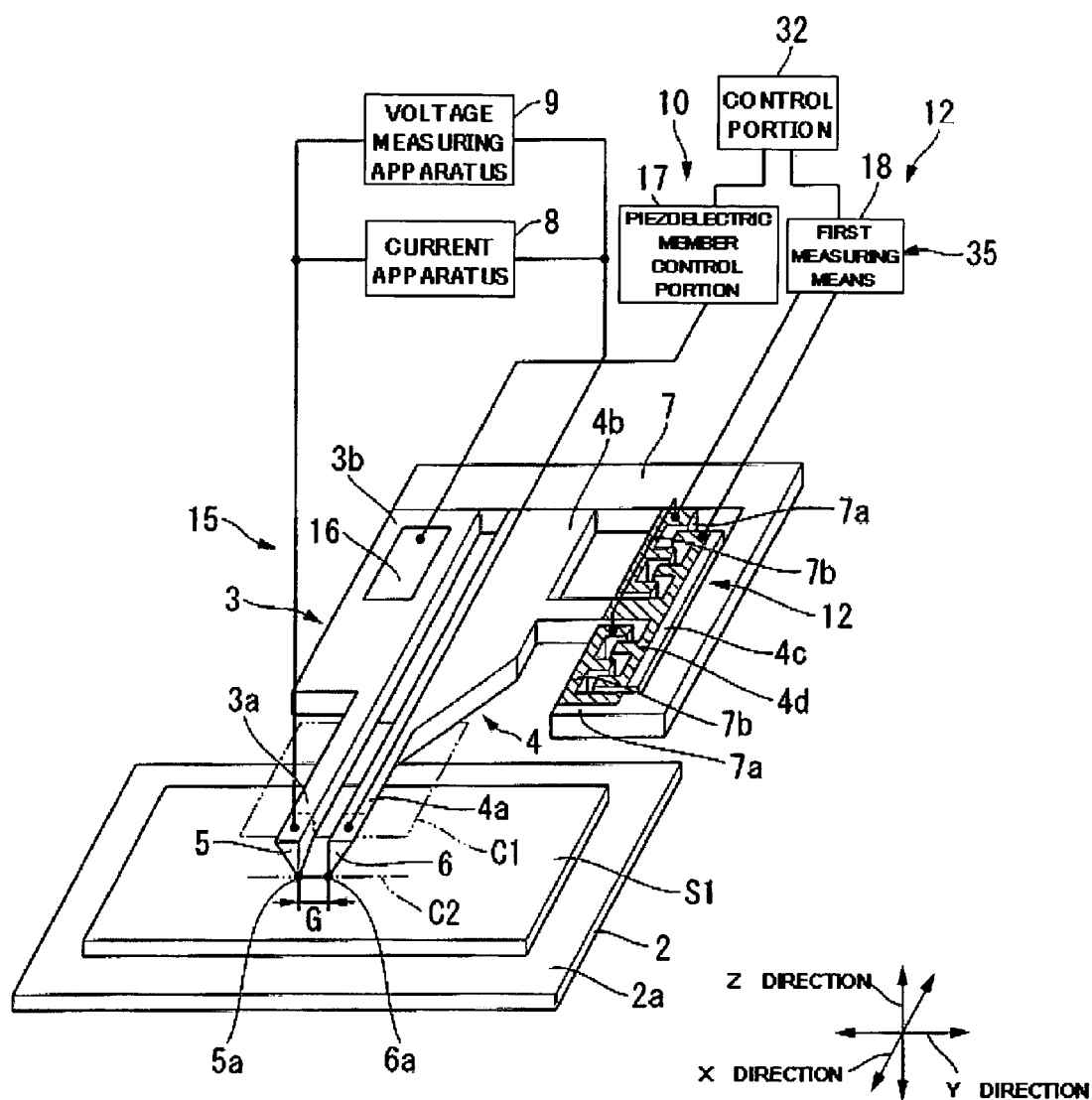
FIG. 2 is a perspective view of an essential portion of the first embodiment of the conductivity measuring apparatus according to the invention.

A first embodiment of a conductivity measuring apparatus according to the invention will be explained in details in reference to the drawings as follows. FIG. 1 through FIG. 8 are explanatory views of the conductivity measuring apparatus of the first embodiment of the invention. FIG. 1 is a constitution view of the conductivity measuring apparatus and FIG. 2 is a perspective view of an essential portion of the conductivity measuring apparatus.

Further, according to the embodiment, an explanation will be given by taking an example of a case of utilizing optical lever system.

As shown in FIG. 1 and FIG. 2, the conductivity measuring apparatus 1 of the embodiment is an apparatus for measuring a conductivity of a sample S1 and generally includes a sample base 2, a two terminals tweezers 15 (tweezer member), a probe base 7, oscillating means 1, displacement measuring means 11, probe driving means 12, moving means 13, first measuring means 35, and controlling means 14.

The sample S1 in a shape of a flat plate constituting an object to be measured is fixed on a sample support face 2a provided at the sample base 2 by fixing means, not illustrated. Further, when normally using the conductivity measuring apparatus 1, the sample supporting face 2a is arranged in parallel with a horizontal face and two directions orthogonal to each other in parallel with the sample support face 2a correspond to the X direction and the Y direction and a direction orthogonal to the X direction and the Y direction corresponds to the Z direction.

The two terminals tweezers 15 is constituted by an observing probe 3 and a grasping probe 4 arranged on an upper side of the sample S1 and arranged to be contiguous to each other in a state of being spaced apart from each other by a predetermined separating distance G on an imaginary face C1 in parallel with the sample support face 2a. Further, a front end 3a of the observing probe 3 is provided with a conductive first tip 5 and a front end 4a of the grasping probe 4 is provided with a conductive second tip 6. Further, also an imaginary line C2 connecting a front end 5a of the first tip 5 and a front end 6a of the second tip 6 is set to be in parallel with the imaginary face C1.

As shown by FIG. 2, also the first tip 5 and the second tip 6 are arranged to be contiguous to each other in a state of being spaced apart from each other by the separating distance G, and a side of a base end 3b of the observing probe 3 and a side of a base end 4b and the grasping probe 4 are fixed to the probe base 7 respectively in a cantilever state.

The first tip 5 and the second tip 6 are formed by a conductive material such as tungsten, and the observing probe 3 and the grasping probe 4 are formed by silicon. Further, the observing probe 3 and the grasping probe 4 are electrically insulated from each other.

Further, the observing probe 3 and the grasping probe 4 are set such that respective resonance frequencies in Z direction differ from each other.

The observing probe 3 is fixed with a piezoelectric member 16 for vibrating the observing probe 3. The piezoelectric member 16 is made to be vibrated at a predetermined frequency (f0) and a predetermined amplitude (A0) by receiving a signal from a piezoelectric member control portion 17 to transmit the vibration to the observing probe 3. Thereby, the observing probe 3 is vibrated at the predetermined frequency (f0) and the predetermined amplitude (A0) similar to the piezoelectric member 16. That is, the piezoelectric member 16 and the piezoelectric member control portion 17 function as the oscillating means 10.

A middle portion of the grasping probe 4 and the probe base 7 are respectively provided with pairs of combteeth (combteeth-shaped part) 4c and combteeth (combteeth-shaped part) 7a in correspondence with each other formed in recessed and projected shapes so as not to be brought into contact with each other. Further, opposed faces of the pairs of the combteeth 4c and the combteeth 7a are respectively provided with electrodes 4d and electrodes 7b.

Further, it is preferable to set such that a rigidity of the combteeth 7a becomes high such that the combteeth 7a is not moved.

The electrode 4d and the electrode 7b are connected to a voltage apparatus 18 for combteeth. When a voltage is applied between the pair of electrodes 4a and the electrodes 7b by the voltage apparatus 18 for combteeth, by attracting the electrode 4a and the electrode 7b, a side of the front end 4a of the grabbing probe 4 is moved to a side of the front end 3a of the observing probe 3, and a distance of separating the first tip 5 and the second tip 6 is adjusted.

That is, the combteeth 4c, the combteeth 7a, the electrode 4d, the electrode 7b and the voltage apparatus 18 for combteeth function as the probe driving means 12. Further, the voltage apparatus 18 for combteeth corresponds to a voltage apparatus in the scope of claims.

Further, the piezoelectric member control portion 17 and the voltage apparatus 18 for combteeth are connected to a control portion 32.

Further, the conductivity measuring apparatus 1 includes oscillating means 10 for vibrating the observing probe 3 by the predetermined frequency and the predetermined amplitude, a current apparatus 8 for generating a current flowing between the first tip 5 and the second tip 6, and a voltage measuring apparatus 9 of measuring a voltage generated between the first tip 5 and the second tip 6. Further, the current apparatus 8 and the voltage measuring apparatus 9 function as the first measuring means 35.

As shown by FIG. 1, the sample base 2 is mounted on an XY scanner 21 and mounted on a vibration isolating base, not illustrated. The XY scanner 21 is constituted by, for example, a piezoelectric element and is made to move by a small amount in XY directions in parallel with the sample support base 2a by being applied with a voltage from an XYZ scanner control portion 22 including an XY scanning system and a Z servo system. Thereby, the sample S1 can be moved by a small amount in XY directions.

Further, a holder portion 19 is fixed to hang down from the Z scanner 23, and the probe base 7 is fixed to a lower side of the holder portion 19.

The Z scanner 23 is constituted by, for example, a piezoelectric element similar to the XY scanner 21 and is made to move by a small amount in Z direction orthogonal to the sample support face 2a, that is, orthogonal to a surface of the sample S1 by being applied with a voltage from the XYZ scanner control portion 22. Thereby, the observing probe 3 and the grabbing probe 4 fixed to the probe base 7 are made to be able to move by a small amount in Z direction.

That is, the XY scanner 21, the Z scanner 23 and the XYZ scanner control portion 22 are made to function as the moving means 13 for moving the probe base 7 and the sample base 2 such that the probe base 7 is moved in directions in parallel with X direction, Y direction and Z direction, that is, in three-dimensional directions relative to the sample support face 2a.

Further, a laser light source 25 for irradiating laser light L to a reflecting face, not illustrated, formed on a back face side of the observing probe 3, and a optical detecting portion 27 of receiving laser light L reflected by the reflecting face by utilizing a mirror 26 are provided above the sample base 2. The optical detecting portion 27 is, for example, a photodiode an incident face of which is divided into 2 or divided into 4 for detecting a state of vibrating the observing probe 3 from an incident position of the laser light L. Further, the optical detecting portion 27 outputs a detected displacement of a state of vibrating the observing probe 3 in Z direction to a preamplifier 28 as a DIF signal. That is, the laser light source 25, the mirror 26, and the optical detecting portion 27 are made to function as the displacement measuring means 11 for measuring the displacement of the observing probe 3.

Further, an optical microscope 29 for observing the sample base 2 is provided above the sample base 2.

The DIF signal outputted from the optical detecting portion 27 is amplified by the preamplifier 28, thereafter, transmitted to an alternating current-direct current converting circuit 30 to be converted into a direct current and is transmitted to a Z voltage feedback circuit 31. The Z voltage feedback circuit 31 carries out a feedback control through the XYZ scanner control portion 22 such that the DIF signal converted into the direct current becomes always constant. Thereby, when an AFM observation of the sample S1 is carried out, a distance between the surface of the sample S1 and the front end 5a of the first tip 5 provided at the observing probe 3 can be controlled such that a state of vibrating the observing probe 3 in Z direction becomes constant, specifically, an amount of attenuating an amplitude or an amount of shifting a frequency, or an amount of shifting a phase becomes constant.

Further, the Z voltage feedback circuit 31 is connected with the control portion 32, and the control portion 32 is made to be able to acquire observing data of the sample base S1 based on a signal transmitted by the Z voltage feedback circuit 31. Further, the control portion 32 outputs XY scanning signals to the XYZ scanner control portion 22. Thereby, a position data or a shape data of the sample S1 is made to be able to be acquired.

In this way, the preamplifier 28, the alternating current-direct current converting circuit 30, the Z voltage feedback circuit 31 and the control portion 32 are made to function as the controlling means 14. Further, the controlling means 14 generally controls the above-described respective constituent portions.

Next, an explanation will be given as follows of steps of calculating a conductivity between measured points of the sample S1 in a small region of the sample S1 after observing the sample S1 on the sample base 2 by the conductivity measuring apparatus 1 constituted in this way.

Figure 3:
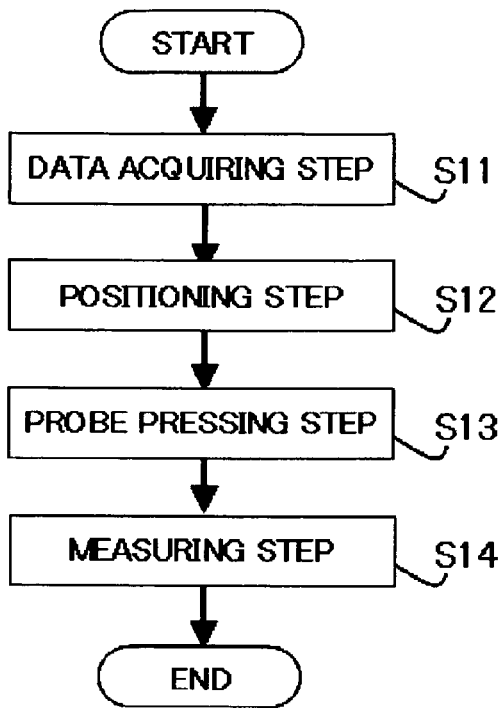
FIG. 3 is a flowchart showing steps of calculating a conductivity by the first embodiment of the conductivity measuring apparatus according to the invention.
Figure 4:
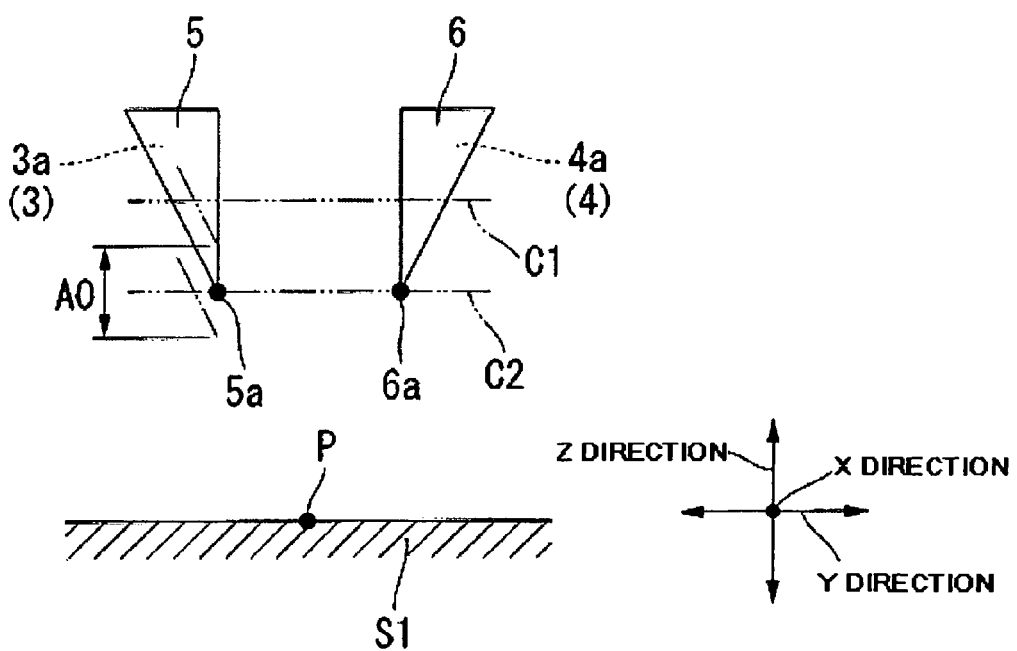
FIG. 4 is an explanatory view showing the steps of calculating the conductivity by the first embodiment of the conductivity measuring apparatus according to the invention.
Figure 5:
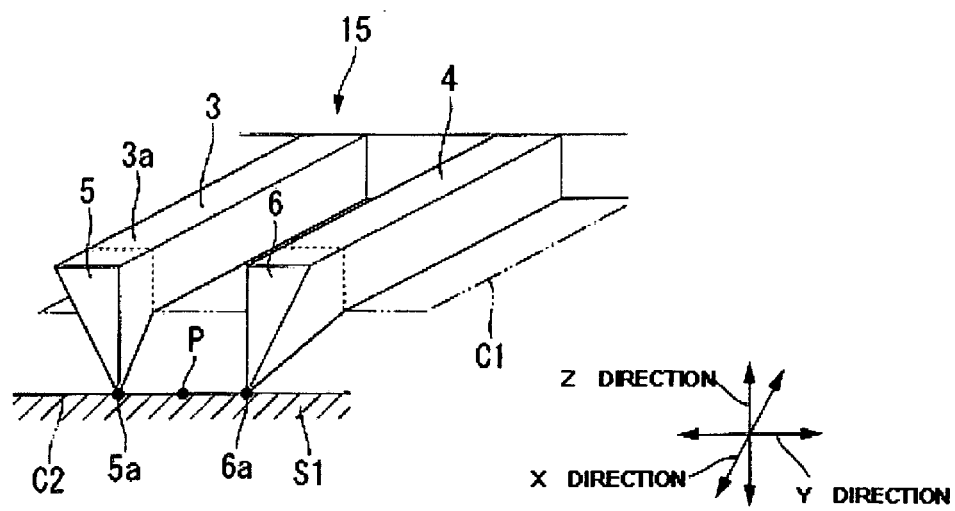
FIG. 5 is an explanatory view of the steps of calculating the conductivity by the first embodiment of the conductivity measuring apparatus according to the invention.
Figure 6:
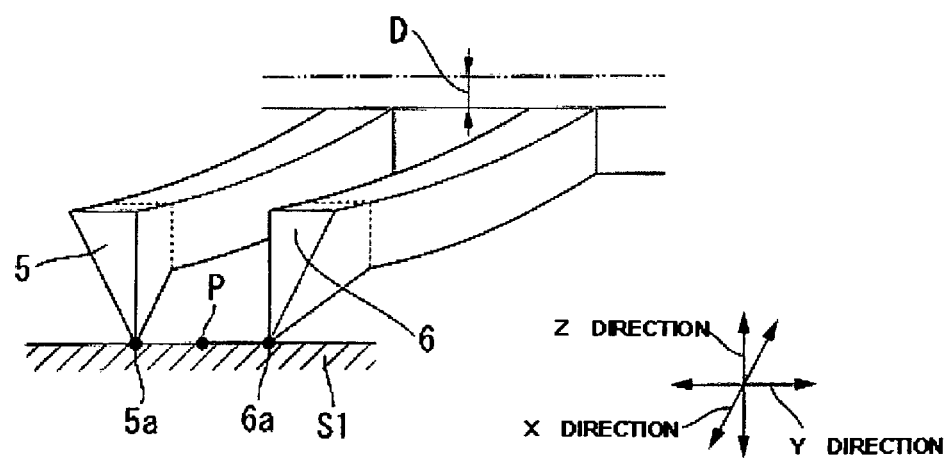
FIG. 6 is an explanatory view showing the steps of calculating the conductivity by the first embodiment of the conductivity measuring apparatus according to the invention.

FIG. 3 is a flowchart showing steps of calculating the conductivity, and FIG. 4 through FIG. 6 are explanatory views showing respective steps of calculating the conductivity.

First, an initial setting is carried out before carrying out the steps. That is, as shown by FIG. 1 and FIG. 2, positions of the laser light source 25 and the optical detecting portion 27 are adjusted such that the laser light L is firmly incident on the reflecting face of the observing probe 3, further, such that the reflecting laser light L is firmly incident on the optical detecting portion 27. Further, a signal is outputted from the piezoelectric control portion 17 to the piezoelectric electric member 16 and the piezoelectric member 16 is vibrated by the predetermined frequency (f0) and the predetermined amplitude (A0). Thereby, as shown by FIG. 4, the observing probe 3 is vibrated by the predetermined frequency (f0) and the predetermined amplitude (A0) in Z direction.

After finishing the initial setting, at a data acquiring step (step S11) shown in FIG. 3, first, a state of a total of the surface of the sample S1 is observed by the optical microscope 29, and an outline of an outer shape of a surface of the sample S1 and an outline position of a measured point are grasped.

Successively, AFM observation of the sample S1 is carried out.

Specifically, as shown by FIG. 1 and FIG. 4, the surface of the sample S1 is scanned by the XY scanner 21 in a state of controlling a height or a distance between the first tip 5 provided at the front end 3a of the observing probe 3 and the surface of the sample S1 while vibrating the observing probe 3 by the predetermined amplitude (A0) in Z direction such that the state of vibrating the observing probe 3 in Z direction becomes constant. At this occasion, the amplitude of the observing probe in Z direction is going to be increased or reduced in accordance with recesses and projections of the surface of the sample S1, and therefore, the amplitude of laser light L (laser light reflected by the reflecting face) incident on the optical detecting portion 27 shown in FIG. 1 differs. The optical detecting portion 27 outputs the DIF signal in accordance with the amplitude to the preamplifier 28. The outputted DIF signal is amplified by the preamplifier 28, converted into the direct current by the alternating current-direct current converting circuit 30, thereafter, transmitted to the Z voltage feedback circuit 31.

The Z voltage feedback circuit 31 carries out the feedback control by moving the Z scanner 23 by a small amount in Z direction by the XYZ scanner control portion 22 such that the DIF signal converted into the direct current becomes always constant (that is, amplitude in Z direction of the observing probe 3 becomes constant). Thereby, the surface of the sample S1 can be scanned in the state of controlling the height or the distance between the surface of the sample S1 and the first tip 5 such that the state of vibrating the observing probe 3 in Z direction becomes constant. Further, the control portion 32 can acquire data of observing the surface of the sample S1 based on a signal transmitted by the Z voltage feedback circuit 31 for moving up and down the Z scanner 23. As a result, the position data and the shape data of the sample S1 can be acquired and it can be grasped at which place of the sample S1 the measured point P is arranged.

Next, at a positioning step (step S12), the measured point P is determined based on the acquired position data and the acquired shape data, the XY scanner 21 and the Z scanner 23 are moved by the XYZ scanner control portion 22, move to position the probe base 7 such that the front end 5a of the first tip 5 and the front end 6a of the second tip 6 are arranged at the measured point P as shown by FIG. 5.

An imaginary line C2 connecting the front end 5a of the first tip 5 and the front end 6a of the second tip 6 is set to be in parallel with the imaginary face C1, that is, in parallel with the sample support face 2a. Further, the sample S1 is constituted by the shape of the flat plate, and therefore, the imaginary line C2 becomes in parallel with an upper face of the sample S1.

Further, by the moving means 13, the two terminals tweezers 15 is moved in a direction in parallel with the sample support face 2a and a direction orthogonal to the sample support face 2a. Therefore, the front end 5a of the first tip 5a and the front end 6a of the second tip 6 can simultaneously be pressed to the sample S1.

Further, it has already been grasped by the AFM observation at which place of the surface of the sample S1 the measured point P is disposed, and therefore, the front end 5a of the first tip 5 and the front end 6a of the second tip 6 can swiftly be positioned.

Next, at a probe pressing step (step S13), as shown by FIG. 6, the two terminals tweezers 14 is moved to a side of the sample S1, that is, in Z direction by a predetermined length D and the front end 5a of the first tip 5 and the front end 6a of the second tip 6 are pressed to the sample S1.

Here, forces of pressing the sample S1 by the respective tips are determined by a spring constant in Z direction of each probe and a bending amount in Z direction, in this case, the predetermined length D. That is, by constituting the bending amount in Z direction of each probe by the predetermined length D at respective measurements, the force of pressing the sample S1 respectively by the front end 5a of the first tip 5 and the front end 6a of the second tip 6 is adjusted to be constant without depending on the measurement.

Thereby, a reproducibility of the force of pressing the measured point P of the sample S1 respectively by the front end 5a of the first tip 5 and the front end 6a of the second tip 6 can be promoted.

Finally, at a measuring step (step S14), first, a constant current flowing between the first tip 5 and the second tip 6 is generated by the current apparatus 8 and a voltage generated between the first tip 5 and the second tip 6 is measured by the voltage measuring apparatus 9.

Further, the voltage generated between the first tip 5 and the second tip 6 is measured by the voltage measuring apparatus 9 while changing an interval between the first tip 5 and the second tip 6 by moving the side of the front end 4a of the grasping probe 4 to the side of the front end 3a of the observing probe 3 by changing the voltage applied between the electrode 4d and the electrode 7b by the voltage apparatus 18 for combteeth.

Figure 7:
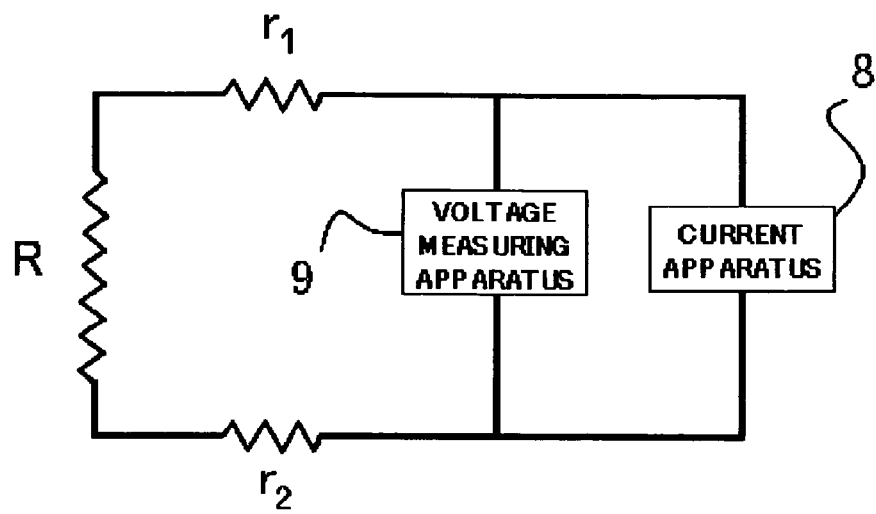
FIG. 7 is a circuit diagram of a portion related to a sample and two probes of the first embodiment of the conductivity measuring apparatus according to the invention.

As described above, a voltage value V generated between the first tip 5 and the second tip 6 is measured by making a current of a constant current value Io flow between the first tip 5 and the second tip 6. At this occasion, as shown by FIG. 7, a synthesized resistance value Q calculated by dividing the measured voltage value by the measured current value includes not only a resistance R between the measured points of the sample S1 but an internal resistance $r_1$ provided by the first tip 5, the observing probe 3, the voltage measuring apparatus 9 and the like, and a contact resistance $r_2$ generated respectively between the first tip 5 and the second tip 6 and the surface of the sample S1. However, a dispersion in the press force is restrained, and therefore, the contact resistance $r_2$ is substantially constant, and also the internal resistance $r_1$ becomes constant by using the same conductivity measuring apparatus.

That is, Equation (2) is derived from Equation (1) shown below.

$$V = Q \times I_o \tag{1}$$

$$Q = R + (r_1 + r_2) \tag{2}$$

Therefore, when the voltage generated between the first tip 5 and the second tip 6 is measured as V1, V2, ... by the voltage measuring apparatus 9 while changing a distance G of separating the first tip 5 and the second tip 6 as $G_1$, $G_2$, Equation (3) through Equation (4) shown below are established.

$$V_1/I_o = I_o = Q_1 = R_1 + (r_1 + r_2) \tag{3}$$

$$V_2/I_o = I_o = Q_2 = R_2 + (r_1 + r_2) \tag{4}$$

where, $R_1, R_2, \ldots$: resistance values for measured intervals $G_1, G_2, \ldots$ of sample S1

Figure 8:
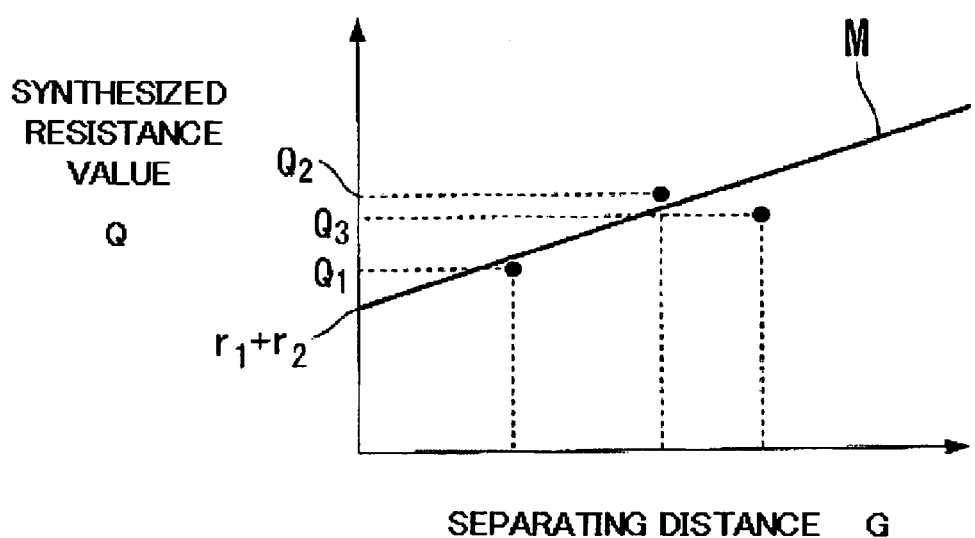
FIG. 8 is an explanatory view of calculating a resistance value of the sample of the first embodiment of the conductivity measuring apparatus according to the invention.

Further, a value calculated by an equation $(r_1+r_2)$ can be provided by approximating a relationship of the synthesized resistance value Q of the ordinate relative to the distance G of separating the first tip 5 and the second tip 6 of the abscissa and calculating a value of a segment thereby as shown by FIG. 8.

That is, a further accurate resistance value R between the measured points of the sample S1 of separating the internal resistance $r_1$ and the contact resistance $r_2$ from the calculated synthesized resistance value Q can be calculated. Further, the conductivity of the sample S1 can be calculated from the calculated resistance value R.

In this way, according to the conductivity measuring apparatus of the embodiment of the invention, the separating distance G between the two terminals tweezers 15 is adjusted by the single probe driving means 12, and therefore, the separating distance G can accurately and continuously be adjusted. Further, the separating distance G can accurately be adjusted, and therefore, the conductivity can accurately be measured by making the separating distance G between the two terminals tweezers 15 near to the predetermined small distance equal to or smaller than, for example, 100 nanometers.

Further, the distance between the pairs of combteeth 4c and combteeth 7a respectively provided at the middle portions of the probe base 7 and the grabbing probe 4 and in correspondence with each other can be adjusted by an electrostatic force operated between the electrode 4d and the electrode 7b by applying a voltage between the pairs of electrodes 4d and the electrodes 7b by the voltage apparatus 18 for combteeth. Thereby, the separating distance G between the observing probe 3 and the grabbing probe 4 can further accurately and continuously be adjusted.

Further, the conductivity between the measured points P of the sample S1 is measured while changing the separating distance G of the observing probe 3 and the grasping probe 4, and therefore, an influence of the separating distance G between the observing probe 3 and the grabbing probe 4 effected on the electric property can be measured, and the conductivity between the measured points P of the sample S1 can further accurately be measured.

Further, according to the first embodiment, the voltage generated between the first tip 5 and the second tip 6 is measured by the voltage measuring apparatus 9 while changing the separating distance G of the first tip 5 and the second tip 6 by generating the constant current flowing between the first tip 5 and the second tip 6 by the current apparatus 8. However, the current flowing between the first tip 5 and the second tip 6 may be measured by the current measuring apparatus while changing the interval between the first tip 5 and the second tip 6 by generating the constant voltage applied between the first tip 5 and the second tip 6 by the constant voltage apparatus 8.

Second Embodiment

Figure 9:
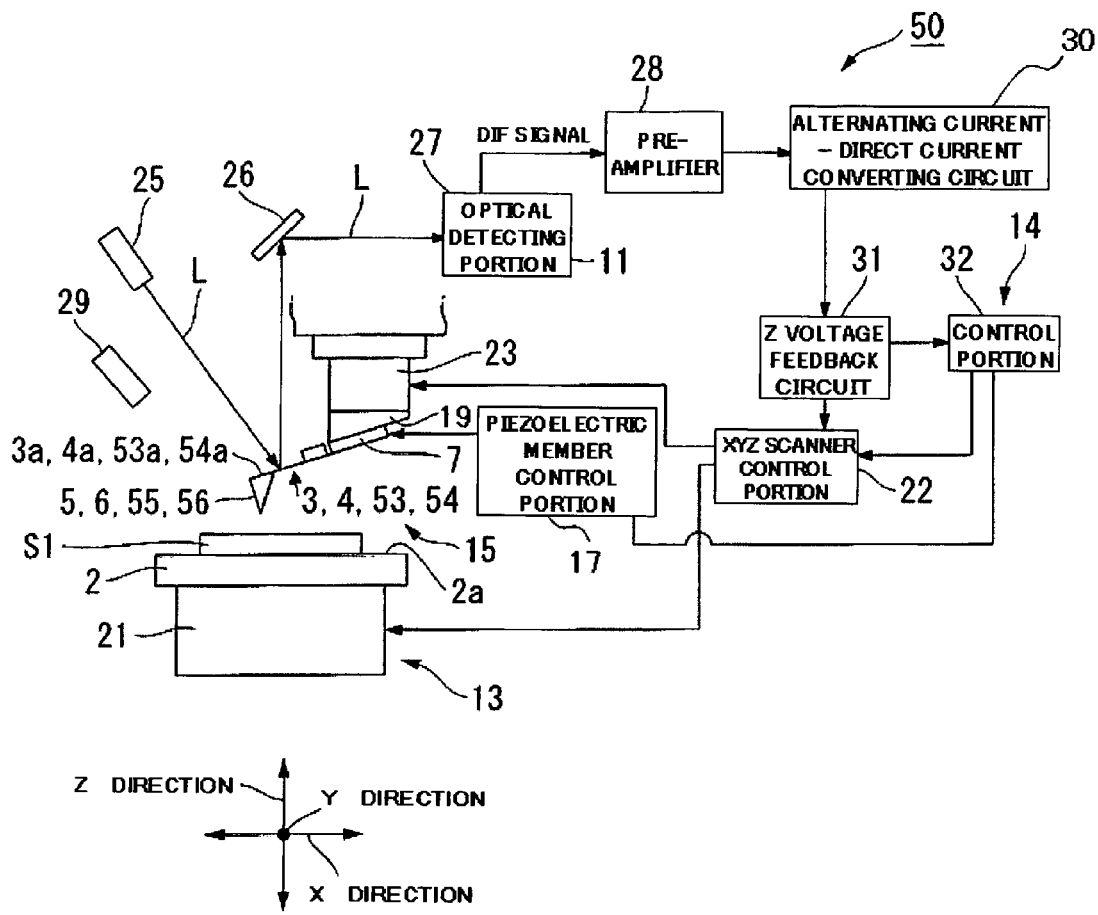
FIG. 9 is a constitution view of a second embodiment of a conductivity measuring apparatus according to the invention.
Figure 10:
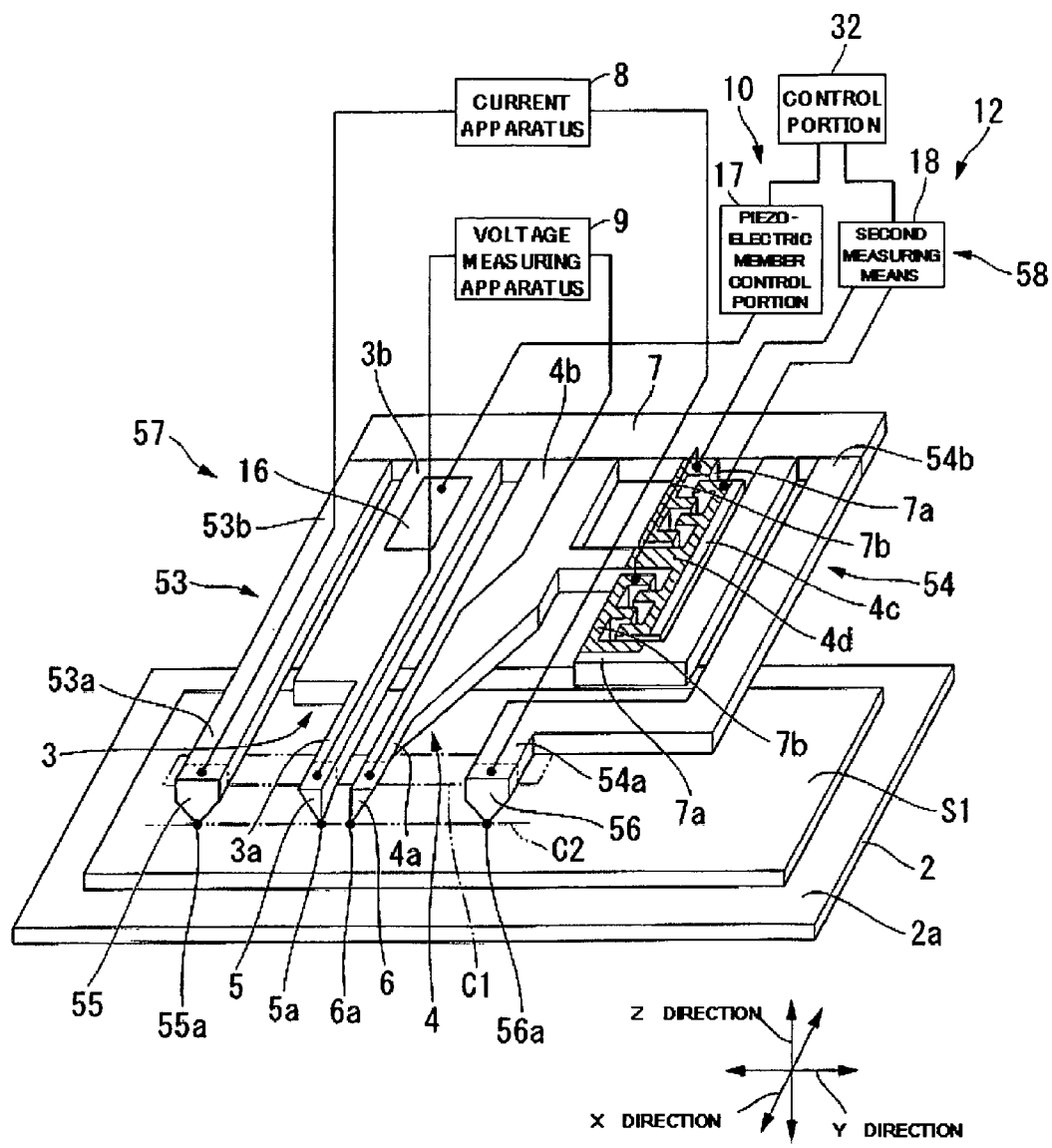
FIG. 10 is a perspective view of an essential portion of the second embodiment of the conductivity measuring apparatus according to the invention.

A second embodiment of the conductivity measuring apparatus according to the invention will be explained in details in reference to the drawings as follows. FIG. 9 through FIG. 13 are explanatory views of a conductivity measuring apparatus of a second embodiment of the invention. FIG. 9 is a constitution view of a conductivity measuring apparatus and FIG. 10 is a perspective view of an essential portion of the conductivity measuring apparatus.

Further, for convenience of explanation, in the second embodiment of the invention, constituent elements which are the same as constituent elements explained in the above-described first embodiment are attached with the same notations and an explanation thereof will be omitted.

The second embodiment differs from the above described first embodiment only in an essential portion of a conductivity measuring apparatus 50. Specifically, as shown in FIG. 9 and FIG. 10, in addition to the observing probe 3 and the grasping probe 4 provided at the conductivity measuring apparatus of the first embodiment, outer sides of the observing probe 3 and the grasping probe 4 are provided with a pair of outer side probes 53, 54 arranged to be remote from the two probes 3, 4.

Respective front ends 53a and 54a of the pair of outer side probes 53 and 54 are provided with outer side styluses 55 and 56. Further, the front end 55a of the outer side stylus 55 and the front end 56a of the outer side stylus 56 are arranged on the imaginary line C2 connecting the front end 5a of the first tip 5 and the front end 6a of the second tip 6.

Further, the probe base 7 fixed with the base end 3b of the observing probe 3 and the base end 4b of the grasping probe 4 according to the first embodiment is fixed with also respective base ends 53b and 54b of the pair of outer side probes 53 and 54 respectively in the cantilever state according to the second embodiment. Further, a 4 terminals tweezers 57 is constituted by the observing probe 3, and the grasping probe 4 and the pair of outer side probes 53 and 54.

Further, the outer side styluses 55 and 56 are formed by a conductive material of, for example, tungsten and the pair of outer side probes 53 and 54 are formed by silicon.

Although the current apparatus 8 of the first embodiment generates the current flowing between the first tip 5 and the second tip 6, the current apparatus 8 of the second embodiment generates a current flowing between the outer side styluses 55 and 56. Further, the voltage measuring apparatus 9 measures the voltage generated between the first tip 5 and the second tip 6 similar to the first embodiment. Further, the current apparatus 8 and the voltage measuring apparatus 9 are made to function as the second measuring means 58.

Next, an explanation will be given as follows of steps of observing the sample S1 on the sample base 2, thereafter, calculating the conductivity between the measured points of the sample S1 at a small region of the sample S1 by the conductivity measuring apparatus 50 constituted in this way.

The steps of the second embodiment are common up to a data acquiring step (step S11) of the first embodiment shown in FIG. 3 and only contents of the steps of a positioning step (step S12) and thereafter differ.

Figure 11:
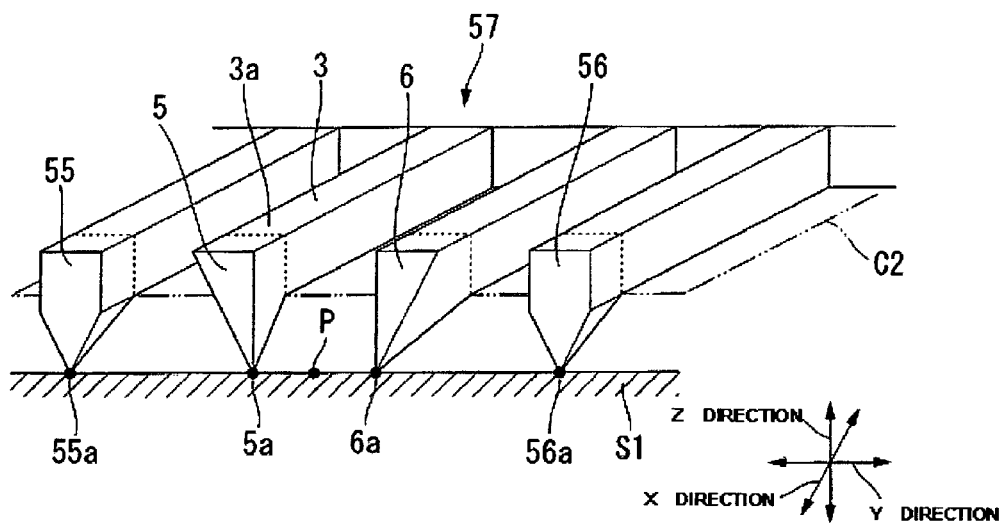
FIG. 11 is an explanatory view showing steps of calculating a conductivity by the second embodiment of the measuring apparatus according to the invention.

At the positioning step (step S12), the measured point P is determined based on acquired position data and acquired shape data, the XY scanner 21 and the Z scanner 23 are moved by the XYZ scanner control portion 22, as shown by FIG. 11, the probe base 7 is moved to position such that the front end 5a of the first tip 5 and the front end 6a of the second tip 6 are arranged at the measured point P to proceed to step S13.

The front end 5a of the first tip 5, and the front end 6a of the second tip 6, a front end 55a of the outer side stylus 55 and a front end 56a of the outer side stylus 56 are arranged on an imaginary line C2 and the imaginary line C2 is set to be in parallel with an imaginary face C1, that is, in parallel with the sample support face 2a. Further, the sample S1 is constituted by a shape of a flat plate, and therefore, the imaginary line C2 is in parallel with an upper face of the sample S1.

Further, a movement is carried out in a direction in parallel with the sample support face 2a and a direction orthogonal to the sample support face 2a by the moving means 13.

The 4 terminals tweezers 57 is moved in a direction in parallel with the sample support face 2a and the direction orthogonal to the sample support face 2a by the moving means 13. Therefore, the front end 5a of the first tip 5, the front end 6a of the second tip 6, the front end 55a of the outer side stylus 55 and the front end 55a of the outer side stylus 56 can simultaneously be pressed to the sample S1.

Further, it has already been grasped by AFM observation at which place on the surface of the sample S1 the measured point P is disposed, and therefore, the front end 5a of the first tip 5 and the front end 6a of the second tip 6 can swiftly be positioned.

Figure 12:
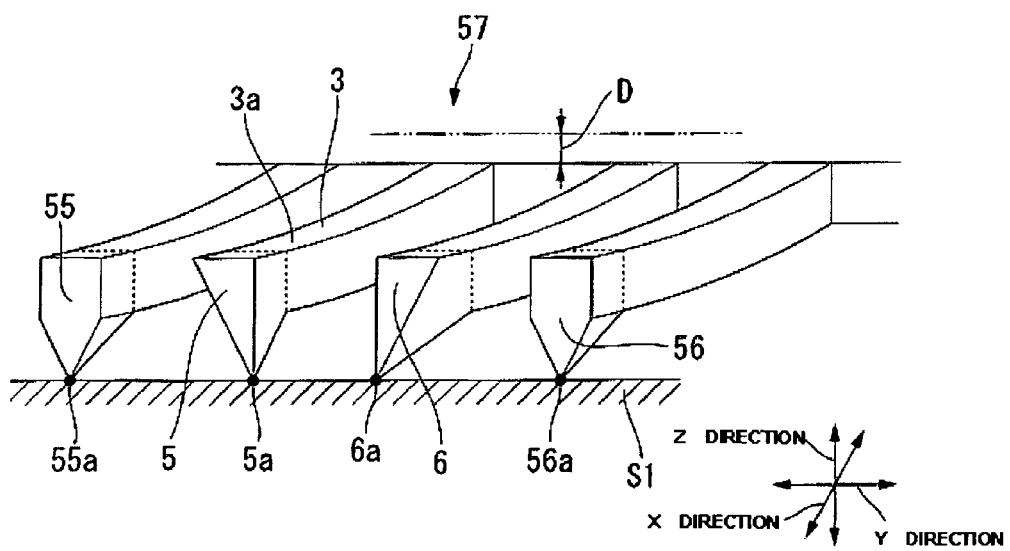
FIG. 12 is an explanatory view showing the steps of calculating the conductivity by the second embodiment of the conductivity measuring apparatus according to the invention.

Next, at the probe pressing step (step S13), the Z scanner 23 is moved by the XYZ scanner control portion 22, as shown by FIG. 12, the 4 terminals tweezers 57 is moved to a side of the sample S1, that is, in Z direction by a predetermined length D, and the front end 5a of the first tip 5, the front end 6a of the second tip 6, the front end 55a of the outer side stylus 55 and the front end 56a of the outer side stylus 56 are pressed to the sample S1.

Here, forces of pressing the sample S1 by 4 of the respective styluses are determined by spring constants in Z direction and bending amounts in Z direction of the respective probes, in this case, the predetermined length D. Therefore, by constituting the bending amounts in Z direction of 4 of the respective probes by the predetermined length D at respective measurements, forces of pressing the sample S1 respectively by the front end 5a of the first tip 5 and the front end 6a of the second tip 6, the front end 55a of the outer side stylus 55 and the front end 56a of the outer side stylus 56 for respective measurements are adjusted to be constant without depending on the measurements.

Thereby, the forces for pressing the front ends of the 4 styluses respectively to the measured point P of the sample S1 can be reproduced.

Finally, at the measuring step (step S14), first, a constant current flowing between the outer side styluses 55, 56 is generated by the current apparatus 8, and a voltage generated between the first tip 5 and the second tip 6 is measured by the voltage measuring apparatus 9.

Further, a voltage generated between the first tip 5 and the second tip 6 is measured by the voltage measuring apparatus 9 while changing the separating distance G of the first tip and the second tip 6 by moving the side of the front end 4a of the grasping probe 4 to the side of the front end 3a of the observing probe 3 by changing the voltage applied between the electrode 4d and the electrode 7b by the voltage apparatus 18 for combteeth.

Figure 13:
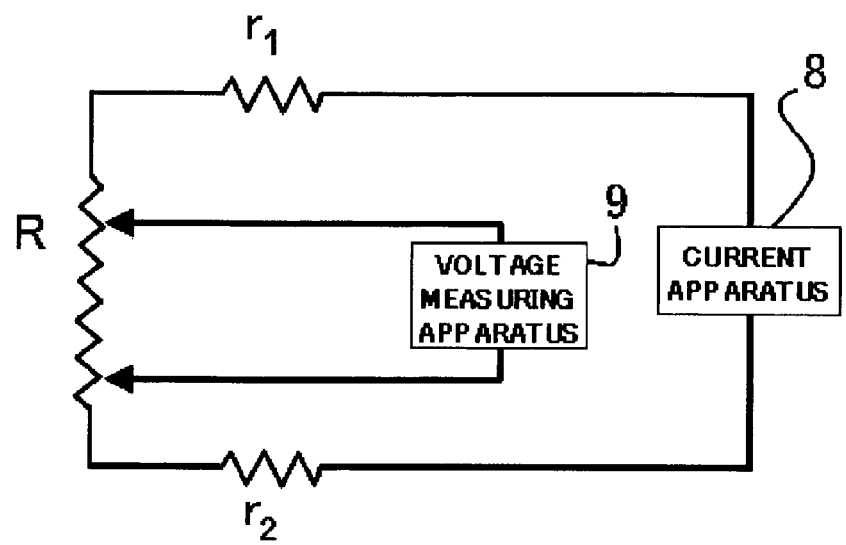
FIG. 13 is a circuit diagram of a portion related to a sample and two probes of the second embodiment of the conductivity measuring apparatus according to the invention.

In this way, according to the conductivity measuring apparatus of the embodiment of the invention, the voltage is measured by using 4 pieces of the styluses of the first tip 5, the second tip 6 and the outer side styluses 55 and 56, and therefore, as shown by FIG. 13, a change in the voltage relative to the distance between the measured points P of the sample S1 can be measured by further effectively restraining an influence of the internal resistance r1 provided to the outer side styluses 55, 56, the outer side probes 53, 54 and the voltage measuring apparatus 9 and the like, and the contact resistance r2 generated between the first tip 5 and the surface of the sample S1 and the like. Further, the conductivity of the sample S1 can be calculated from the measured voltage.

In this way, the conductivity between the measured points of the sample S1 can be calculated by restraining a dispersion in the force of pressing the sample S1 by the measurement and a dispersion in the pressing force among the styluses.

Further, according to the second embodiment, the constant current flowing between the outer side styluses 55 and 56 is generated by the current apparatus 8, and the voltage generated between the first tip 5 and the second tip 6 is measured by the voltage measuring apparatus 9 while changing the separating distance G of the first tip 5 and the second tip 6. However, a constant voltage applied between the outer side styluses 55 and 56 may be generated by the constant voltage apparatus 8, and the current flowing between the first tip 5 and the second tip 6 may be measured by the current measuring apparatus while changing the interval between the first tip 5 and the second tip 6.

Third Embodiment

A third embodiment of a conductivity measuring apparatus according to the invention will be explained in details in reference to the drawings as follows. Further, for convenience of explanation, in the third embodiment of the invention, constituent elements which are the same as constituent elements explained in the above-described first embodiment and second embodiment are attached with the same notations and an explanation thereof will be omitted.

Figure 14:
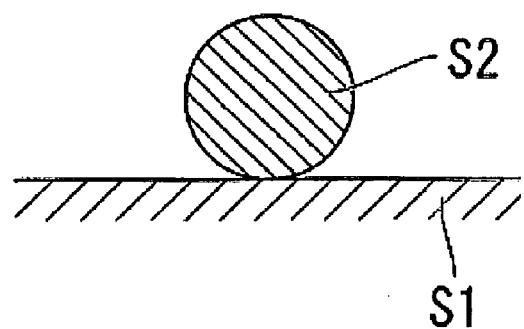
FIG. 14 is an explanatory view of a small predetermined portion of the sample.

The third embodiment is the same as the first embodiment in the constitution of the conductivity measuring apparatus 1 and is different therefrom only in a shape of a sample a conductivity of which is measured and a portion of steps of measuring the conductivity. Specifically, although according to the first embodiment, the sample S1 in the shape of the flat plate is measured, according to the third embodiment, as shown by FIG. 14, for example, a small predetermined portion S2 of the sample S1 having a diameter equal to or smaller than several micrometers constitutes an object of measurement.

Figure 15:
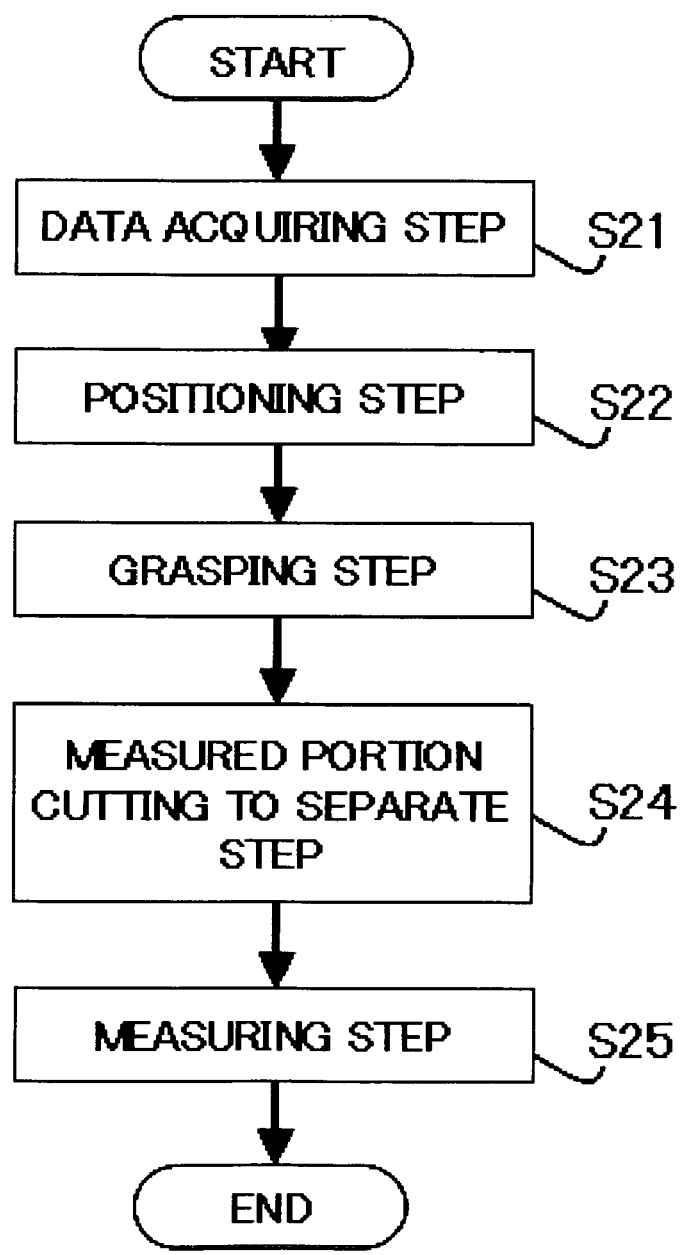
FIG. 15 is a flowchart showing steps of calculating a conductivity by a third embodiment of a conductivity measuring apparatus according to the invention.
Figure 16:
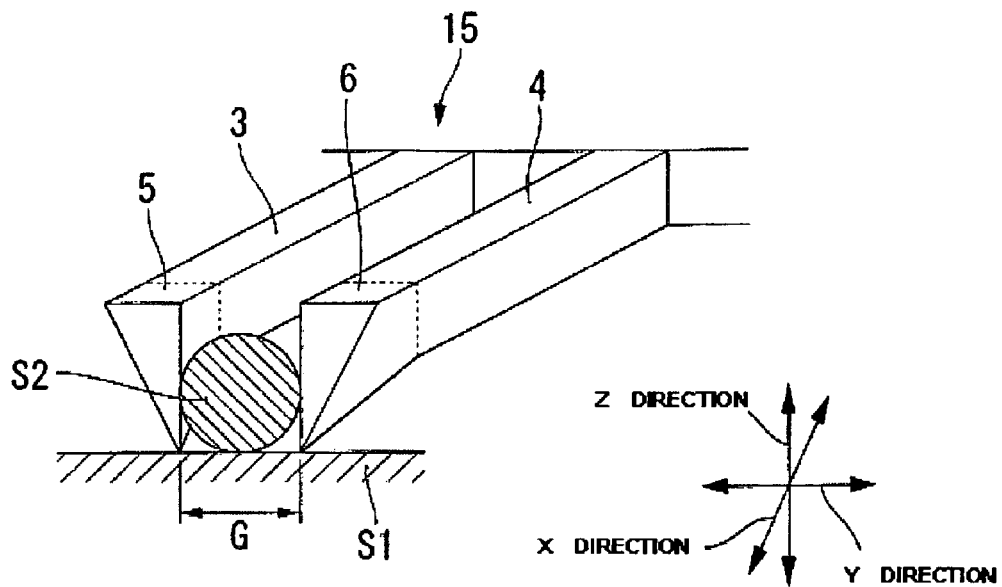
FIG. 16 is an explanatory view showing steps of calculating the conductivity by the third embodiment of the conductivity measuring apparatus according to the invention.
Figure 17:
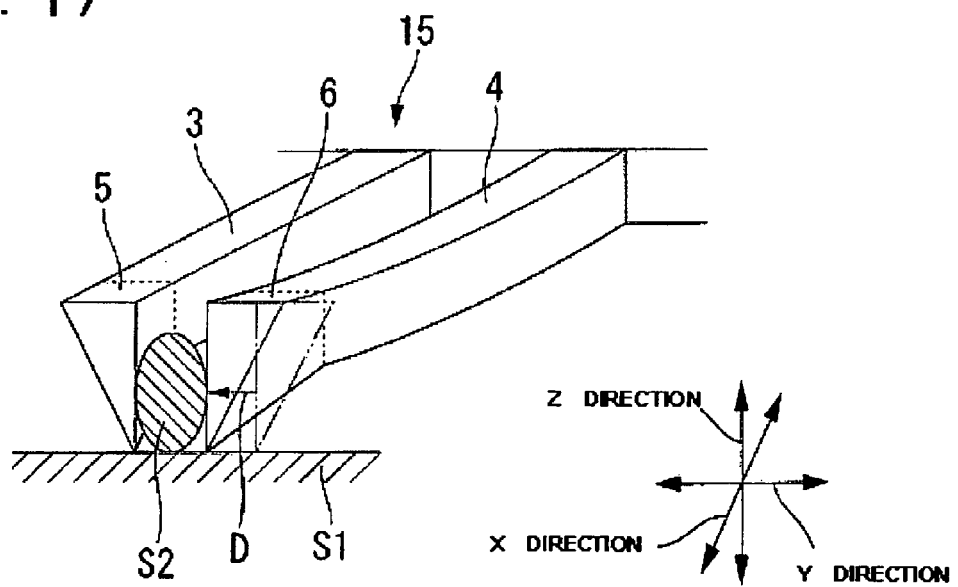
FIG. 17 is an explanatory view showing the steps of calculating the conductivity by the third embodiment of the conductivity measuring apparatus according to the invention.

Next, an explanation will be given as follows of steps of calculating a conductivity of a small predetermined portion after observing the sample on the sample base. FIG. 15 is a flowchart showing steps of calculating the conductivity, and FIG. 16 and FIG. 17 are explanatory views of the conductivity measuring apparatus of the third embodiment.

Further, the initial step described in the first embodiment is carried out before carrying out respective steps of the third embodiment.

After finishing the initial setting, at a data acquiring step (step S21) shown in FIG. 15, a step the same as the data acquiring step (step S11) shown in FIG. 3 of the first embodiment is carried out.

However, according to the embodiment, by AFM observation of the sample S1, a position and a shape of the predetermined portion S2 are grasped to find out by what surface shape (height, outer shape or the like) the sample S1 is constituted.

Next, at a positioning step (step S22), the position of the predetermined portion S2 is determined based on acquired position data and shape data, the XY scanner 21 and the Z scanner 23 are moved by the XYZ scanner control portion 22, further, the voltage applied between the electrode 4d and the electrode 7b is changed by the voltage apparatus 18 for combteeth. Further, as shown by FIG. 16, positioning is carried out to squeeze the predetermined portion S2 of the sample 1 by the first tip 5 provided at the observing probe 3 and the second tip 6 provided at the grasping probe 4.

It has already been grasped at which place on the surface of the sample S1 the predetermined portion S2 is disposed, and therefore, the first tip 5 and the second tip 6 can swiftly be positioned.

Next, at a grasping step (step S23), the voltage applied between the electrode 4d and the electrode 7b is changed by the voltage apparatus 18 for combteeth, as shown by FIG. 17, the predetermined portion S2 of the sample S1 is pressed to be grasped by the two terminals tweezers 15 by making the separating distance G between the first tip 5 and the second tip 6 short by the predetermined distance D.

A force of pressing the predetermined portion S2 by the two terminals tweezers 15 is determined by a spring constant and a bending amount to a side opposed to the squeezed predetermined portion S2. Bending amounts of the respective probes become constant without depending on the measurement, and therefore, the reproducibility of the pressing force can be promoted by making forces for pressing the predetermined portion S2 by the respective probes of the two terminals tweezers 15 respectively constant.

Figure 18:
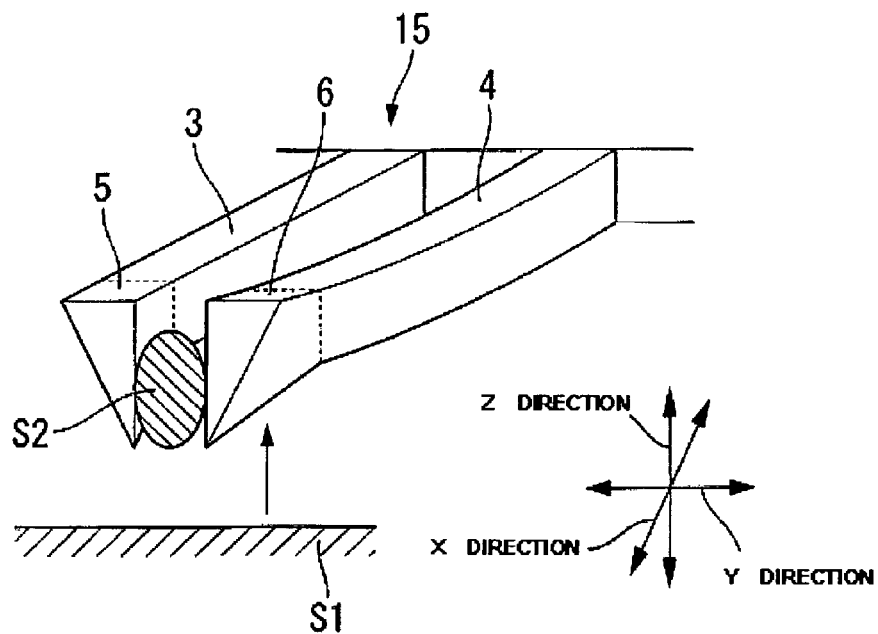
FIG. 18 is an explanatory view showing the steps of calculating the conductivity by the third embodiment of the conductivity measuring apparatus according to the invention.

Next, at a measured portion cutting to separate step (step S24), the Z scanner 23 is moved by the XYZ scanner control portion 22, as shown by FIG. 18, the predetermined portion S2 of the sample S1 grasped by the first tip 5 and the second tip 6 is lifted in Z direction to cut to separate from the other portion of the sample S1.

Finally, at a measuring step (step S25), first, a constant current flowing between the first tip 5 and the second tip 6 is generated by the current apparatus 8, and a voltage generated between the first tip 5 and the second tip 6 is measured by the voltage measuring apparatus 9.

Figure 19:
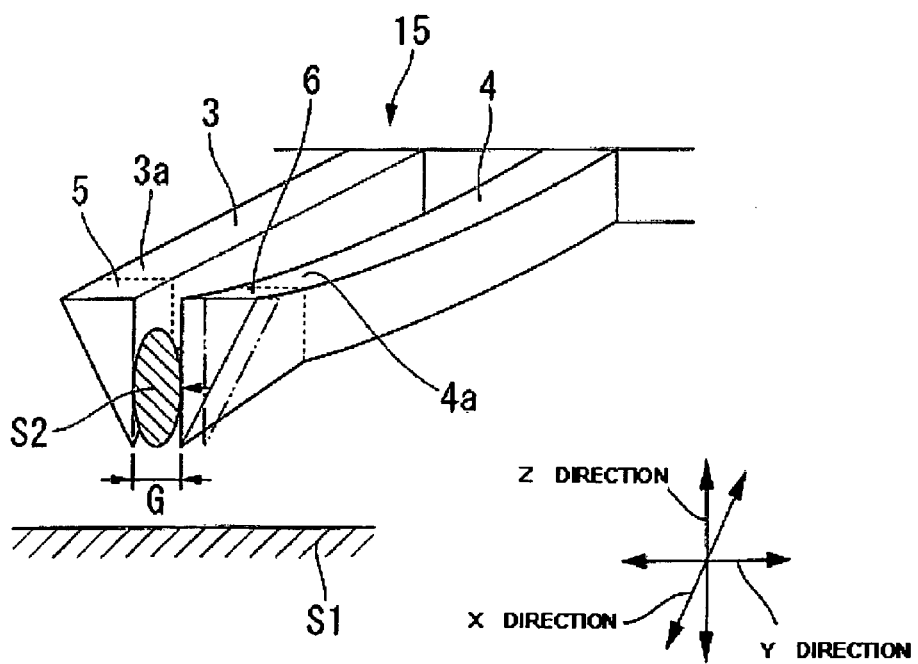
FIG. 19 is an explanatory view showing the steps of calculating the conductivity by the third embodiment of the conductivity measuring apparatus according to the invention.

Further, by changing the voltage applied between the electrode 4d and the electrode 7b by the voltage apparatus 18 for combteeth, as shown by FIG. 19, the side of the front end 4a of the grabbing probe 4 is moved to the side of the front end 3a of the observing probe 3, while changing the separating distance G of the first tip 5 and the second tip 6, the voltage generated between the first tip 5 and the second tip 6 is measured by the voltage measuring apparatus 9.

In this way, according to the conductivity measuring apparatus of the embodiment of the invention, the separating distance G between the first tip 5 and the second tip 6 is adjusted by the single probe driving means 12, and therefore, the separating distance G can accurately and continuously be adjusted and the conductivity can be measured by accurately picking up the small predetermined portion S2.

Further, the conductivity is measured by lifting the predetermined portion S2, and therefore, the conductivity between the predetermined portions S2 is measured without being influenced by the sample S1 and the conductivity can further accurately be measured.

Further, the conductivity between the predetermined portions S2 is measured while changing the grasping force between the predetermined portions S2 by changing the separating distance G. Therefore, an influence of the pressing force between the predetermined portions S2 of the sample S1 effected on an electric property can be measured and the conductivity between the predetermined portions S2 can further accurately be measured.

Further, according to the third embodiment, the constant current flowing between the first tip 5 and the second tip 6 is generated by the current apparatus 8, while changing the separating distance G of the first tip 5 and the second tip 6, the voltage generated between the first tip 5 and the second tip 6 is measured by the voltage measuring apparatus 9. However, a constant voltage applied between the first tip 5 and the second tip 6 may be generated by the constant voltage apparatus 8, and a current flowing between the first tip 5 and the second tip 6 may be measured while changing the interval between the first tip 5 and the second tip 6.

Although, as described above, a detailed description has been given of the first embodiment, the second embodiment and the third embodiment with reference to the drawings, the specific features of the invention are not limited to these embodiments but also includes variations without departing from the gist of the invention.

For example, although according to the first embodiment through the third embodiment, the first tip 5 is provided at the front end 3a of the observing probe 3. However, the first tip 5 may be integrated to the observing probe 3 to be conductive. The same goes also with the grabbing probe 4 and the pair of outer side probes 53 and 54.

Further, according to the first embodiment through the third embodiment, front ends of the styluses of the respective probes are extended from the respective probes to a lower side and the imaginary line C2 connecting the front ends of the styluses is not disposed on the imaginary face C1 arranged with the respective probes along therewith. However, there may be constructed a constitution in which the imaginary line C2 is disposed on the imaginary face C1.

Further, according to the first embodiment through the third embodiment, the probe driving means 12 is provided with the combteeth having the electrode utilizing the electrostatic force. However, the side of the front end 4a of the grabbing probe 4 may be moved by a thermal actuator.

Further, according to the first embodiment through the third embodiment, the conductivity is measured by changing the separating distance G between the first tip 5 and the second tip 6 by the measuring step. However, the conductivity may be measured without changing the separating distance G.

Further, although according to the third embodiment, the conductivity is measured by lifting the predetermined portion S2, the conductivity of the predetermined portion S2 may be measured without lifting the predetermined portion S2. Or, instead of lifting the predetermined portion S2, a lifting mechanism may be provided on the side of the sample base 2, and the measured sample S1 may be moved down to cut to separate from the predetermined portion S2.

Further, although according to the third embodiment, the conductivity is measured while changing the grasping force between the predetermined portions S2, the conductivity of the predetermined portion S2 may be measured by making the grasping force between the predetermined portions S2 constant without changing the grasping force.

Further, according to the first embodiment through the third embodiment, the data acquiring step is carried out, and the surface shape of the sample S1 is grasped by acquiring position data and shape data by carrying out AFM observation of the sample S1. However, position data and shape data of the sample S1 previously acquired separately may be utilized by dispensing with the data acquiring step.

Further, according to the first embodiment through the second embodiment, the observing probe 3 is positioned based on position data and shape data acquired by carrying out AFM observation. However, the positioning may be carried out by vibrating the observing probe 3 again and by observing a state of the vibration also in the positioning.

Further, although in the first embodiment and the third embodiment the relative movement between the two terminal tweezers 14 and the sample S1 is accomplished by moving the two terminals tweezers relative to the sample S1 which is fixed, the relative movement may also be accomplished by moving the sample S1 relative to the two terminals tweezers 14 which is fixed.

Also in the second embodiment, the sample S1 may be moved by fixing the 4 terminals tweezers 57.

What is claimed is:

1. A conductivity measuring apparatus comprising:
a sample base having a sample support face configured to support a sample;
a probe base;
a tweezer member connected to the probe base and comprised of an observing probe and a grasping probe having first and second tips, respectively, and arranged adjacent to and spaced apart from each other by a predetermined separating distance, the observing and grasping probes being configured for arrangement above the sample support face of the sample base in a state in which the predetermined separating distance extends along a face in parallel with the sample support face;
moving means for moving the sample base and the tweezer member relative to each other in a direction parallel with the sample support face and in a direction orthogonal to the sample support face to bring a front end of each of the first and second tips of the observing probe and the grasping probe, respectively, into contact with two respective contact points on the sample;
oscillating means for vibrating the observing probe;
displacement measuring means for measuring a displacement of the vibrating observing probe;
probe driving means for moving the grasping probe toward and away from the observing probe to adjust the predetermined separating distance between the grasping probe and the observing probe, the probe driving means comprising a pair of combteeth-shaped parts one of which is provided on the probe base and the other of which is provided on a middle portion of the grasping probe, a pair of electrodes disposed on respective opposite faces of each combteeth-shaped part, and a voltage apparatus for applying a voltage between the pair of electrodes for each combteeth-shaped part; and
measuring means for generating a current flow between the first and second tips of the respective observing and grasping probes in a state in which the front ends of the first and second tips contact two respective contact points on the sample, and for measuring a conductivity between the two respective contact points on the sample from an electrical property between the observing and grasping probes.

2. A conductivity measuring method using the conductivity measuring apparatus according to claim 1, the conductivity measuring method comprising:

a positioning step of positioning the first and second tips of the respective observing and grasping probes proximate measuring points on the sample by adjusting the predetermined separating distance between the observing and grasping probes using the probe driving means, observing the sample with an atomic force microscope, and scanning the observation probe along the sample using the moving means;

a probe pressing step of respectively moving the first and second tips of the observing and grasping probes towards the sample relatively by a predetermined length and pressing front ends of the respective first and second tips into contact with the sample; and a measuring step of measuring the conductivity between the measuring points on the sample by generating a current flow between the first and second tips of the respective observing and grasping probes using the measuring means and while the front ends of the first and second tips contact the sample.

3. A conductivity measuring method using the conductivity measuring apparatus according to claim 1, the conductivity measuring method comprising:

a positioning step of positioning the first and second tips of the respective observing and grasping probes proximate a predetermined portion of the sample by adjusting the predetermined separating distance between the observing and grasping probes using the probe driving means, observing the sample with an atomic force microscope, and scanning the observation probe along the sample using the moving means;

a grasping step of grasping the predetermined portion of the sample using the observing and grasping probes by reducing the predetermined separating distance between the observing and grasping probes using the probe driving means; and using the measuring means, a measuring step of measuring the conductivity of the predetermined portion of the sample by generating a current flow between the first and second tips of the respective observing and grasping probes while the predetermined portion of the sample is grasped using the observing and grasping probes and measuring the conductivity of the predetermined portion of the sample from an electrical property between the observing and grasping probes.

4. A method according to claim 3; further comprising, before the measuring step, the step of cutting and separating from the sample the predetermined portion of the sample grasped by the observation and grasping probes.

5. A method according to claim 4; wherein in the measuring step, the conductivity of the predetermined portion of the sample is measured while varying a grasping force of the observing and grasping probes by changing the predetermined separating distance between the observing and grasping probes using the probe driving means.

6. A method according to claim 2; wherein in the measuring step, the conductivity between the measuring points of the sample is measured while varying the separating distance between the observing probe and the grasping probe using the probe driving means.

7. A conductivity measuring apparatus comprising:

a sample base having a sample support face configured to support a sample;

a probe base;

a tweezer member connected to the probe base and comprised of an observing probe having a front end, a grasping probe having a front end, and a pair of outer side probes having respective front ends and disposed in spaced part relation from respective outer sides of the observing and grasping probes, the observing probe and the grasping probe being arranged adjacent to and spaced apart from each other by a predetermined separating distance, and the observing and grasping probes being configured for arrangement above the sample support face of the sample base in a state in which the predetermined separating distance extends along a face in parallel with the sample support face;

moving means for moving the sample base and the tweezer member relative to each other in a direction in parallel with the sample support face and in a direction orthogonal to the sample support face to bring the front end of each of the observing and grasping probes and each of the outer side probes into contact with a corresponding contact point on the sample;

oscillating means for vibrating the observing probe;

displacement measuring means for measuring a displacement of the vibrating observing probe;

probe driving means for adjusting a distance between the observing and grasping probes by moving the grasping probe toward and away from the observing probe, the probe driving means comprising a pair of combteeth-shaped parts one of which is provided on the probe base and the other of which is provided on a middle portion of the grasping probe, a pair of electrodes disposed on respective opposite faces of each combteeth-shaped part, and a voltage apparatus for applying a voltage between the pair of electrodes for each combteeth-shaped part; and measuring means for generating a current flow between the front ends of the outer side probes in a state in which the front ends of the outer side probes and the front ends of the observing and grasping probes contact the corresponding contact points on the sample, and for measuring a conductivity between the two contact points on the sample in contact with the front ends of the observing and grasping probes from an electrical property between the observing and grasping probes.

8. A conductivity measuring method using the conductivity measuring apparatus according to claim 7, the conductivity measuring method comprising:

a positioning step of positioning the front ends of the observing and grasping probes proximate measuring points on the sample by adjusting the predetermined separating distance between the observing and grasping probes using the probe driving means, observing the sample with an atomic force microscope, and scanning the observation probe along the sample using the moving means;

a probe pressing step of respectively moving the front ends of the observing and grasping probes and the outer side probes towards the sample relatively by a predetermined length and pressing the front ends of the observing and grasping probes and the outer side probes into contact with the sample using the moving means; and a measuring step of measuring the conductivity between the measuring points on the sample on the basis of an electrical property between the observing and grasping probes by generating a current flow between the outer side probes using the measuring means and while the front ends of the observing and grasping probes and the outer side probes contact the sample.

9. A method according to claim 8; wherein in the measuring step, the conductivity between the measuring points of the sample is measured while varying the separating distance between the observing probe and the grasping probe using the probe driving means.

10. A conductivity measuring apparatus comprising:
a sample base for supporting a sample on a surface thereof;
a probe base having a first pair of electrodes disposed on respective opposite surfaces of a portion of the probe base;
an observing probe supported by the probe base in a cantilever state, the observing probe having a first conductive tip;
a grasping probe supported by the probe base in a cantilever state and arranged adjacent to and spaced apart from the observing probe by a predetermined separating distance so that the grasping and observing probes lie on a plane that is generally parallel to the surface of the sample base when grasping and observing probes are arranged above the surface of the sample base, the grasping probe having a second conductive tip and second pair of electrodes disposed on respective opposite surfaces of a portion of the grasping probe confronting the portion of the probe base;
a voltage apparatus that applies a voltage between the first and second pairs of electrodes to cause the grasping probe to selectively move toward and away from the observing probe to thereby adjust the predetermined separating distance between the grasping and observing probes;
a movement mechanism that moves the sample base and the observing and grasping probes relative to each other in a direction generally parallel to the surface of the sample base and in a direction generally orthogonal to the surface of the sample base to bring the first and second conductive tips of the observing and grasping probes into contact with respective contact points on the sample;
a current apparatus that generates a current flow between the first and second conductive tips of the observing and grasping probes while the first and second conductive tips contact the respective contact points on the sample; and
a measuring apparatus that measures a conductivity between the contact points on the sample on the basis of the current flow generated between the first and second conductive tips of the observing and grasping probes.

11. A conductivity measuring apparatus according to claim 10; further comprising a piezoelectric member connected to the observing probe and configured to undergo vibration at a predetermined frequency and amplitude and to transmit the vibration to the observing probe to thereby vibrate the observing probe at the predetermined frequency and amplitude.

12. A conductivity measuring apparatus according to claim 11; further comprising a displacement measurement device for measuring a displacement of the vibrating observing probe.

13. A conductivity measuring apparatus according to claim 10; wherein the portion of the probe base comprises a first combteeth-shaped part having the first pair of electrodes on respective opposite surfaces first combteeth-shaped part; and wherein the portion of the grasping probe comprises a second combteeth-shaped part having the second pair of electrodes disposed on respective opposite surfaces of the second combteeth-shaped part.

* * * * *